(12) United States Patent
Furuyama

(10) Patent No.: US 7,868,342 B2
(45) Date of Patent: Jan. 11, 2011

(54) SEMICONDUCTOR LIGHT EMITTING DEVICE

(75) Inventor: Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/729,310

(22) Filed: Mar. 23, 2010

(65) Prior Publication Data
US 2010/0171141 A1 Jul. 8, 2010

Related U.S. Application Data

(62) Division of application No. 12/133,604, filed on Jun. 5, 2008, now Pat. No. 7,714,344.

(30) Foreign Application Priority Data

Jun. 5, 2007 (JP) ............... 2007-149494

(51) Int. Cl.
*H01L 33/00* (2010.01)

(52) U.S. Cl. ............ 257/98; 257/103; 257/E33.005; 257/E33.067

(58) Field of Classification Search ............ 257/79, 257/88, 95, 92, 103, 106, 117, E33.013, E33.068, 257/E31.057, E33.005, E33.067
See application file for complete search history.

(56) References Cited

U.S. PATENT DOCUMENTS 3,622,906 A 11/1971 Nyul
3,675,064 A 7/1972 Coleman et al.

OTHER PUBLICATIONS

Shin-ichi Saito, et al., "Electro-Luminescence from Ultra-Thin Silicon", Japanese Journal of Applied Physics, vol. 45, No. 27, 2006, pp. L679-L682.

*Primary Examiner*—Victor A Mandala
*Assistant Examiner*—Whitney Moore
(74) *Attorney, Agent, or Firm*—Oblon, Spivak, McClelland, Maier & Neustadt, L.L.P.

(57) ABSTRACT

A semiconductor light emitting device includes a silicon substrate, a p-type semiconductor layer provided on the silicon substrate, a n-type semiconductor layer provided on the silicon substrate, the n-type semiconductor layer adjoining the p-type semiconductor layer, and a light emitting section formed at a p-n homojunction between the p-type semiconductor layer and the n-type semiconductor layer. The p-n homojunction is substantially perpendicular to a major surface of the silicon substrate. The p-n homojunction is corrugated with a period matched with an integer multiple of an emission wavelength at the light emitting section.

11 Claims, 9 Drawing Sheets

SEMICONDUCTOR LIGHT EMITTING DEVICE

CROSS-REFERENCE TO RELATED APPLICATIONS

This application is a divisional of and claims the benefit of priority under 35 U.S.C. §120 from U.S. Ser. No. 12/133,604 filed Jun. 5, 2008, and claims the benefit of priority under 35 U.S.C. §119 from Japanese Patent Application No. 2007-149494 filed on Jun. 5, 2007; the entire contents of each of which are incorporated herein by reference.

BACKGROUND OF THE INVENTION

The performance improvement of electronic devices such as bipolar transistors and field-effect transistors has dramatically increased the operating speed of large-scale integrated circuits (LSI). However, although achieving performance improvement, the scaling down of transistors has caused a serious problem with electrical interconnects therebetween in relation to the increase of the electrical line resistance and the capacitance between adjacent electrical line, which is becoming a bottleneck in the improvement of LSI performance.

In view of the foregoing problem with electrical interconnects, some proposals have been made for an optically interconnected LSI, where the elements therein are optically interconnected. The optical interconnect has marginal frequency dependence of loss at frequencies from DC to 100 GHz or more. Furthermore, the interconnect path suffers from no electromagnetic interference. Hence interconnection at several 10 Gbps or more can be easily realized.

For the purpose of integration into an LSI, the semiconductor light emitting device serving as a light source for optical interconnects needs to be easily coupled to a light waveguide for transmitting light and to be highly adaptable to LSI processes. For use as a light source for intra-LSI optical interconnection, a silicon-based light emitting device is desirable. For example, a silicon-based semiconductor light emitting device is disclosed in Japanese Journal of Applied Physics, Vol. 45, No. 27 (2006) p. L679 (hereinafter referred to as Non-Patent Document 1).

The device disclosed in Non-Patent Document 1 is a light emitting diode that emits light by spontaneous emission. Because its operating speed is restricted by carrier lifetime, there is little hope for fast operation.

SUMMARY OF THE INVENTION

According to an aspect of the invention, there is provided a semiconductor light emitting device including: a silicon substrate; a p-type semiconductor layer provided on the silicon substrate; a n-type semiconductor layer provided on the silicon substrate, the n-type semiconductor layer adjoining the p-type semiconductor layer; and a light emitting section formed at a p-n homojunction between the p-type semiconductor layer and the n-type semiconductor layer, the p-n homojunction being substantially perpendicular to a major surface of the silicon substrate, and the p-n homojunction being corrugated with a period matched with an integer multiple of an emission wavelength at the light emitting section.

According to another aspect of the invention, there is provided a semiconductor light emitting device including: a silicon substrate; a p-type semiconductor layer provided on the silicon substrate; a n-type semiconductor layer provided on the silicon substrate, the n-type semiconductor layer adjoining the p-type semiconductor layer; and a light emitting section formed at a p-n homojunction between the p-type semiconductor layer and the n-type semiconductor layer, the p-n homojunction being substantially perpendicular to a major surface of the silicon substrate, and the p-n homojunction having a width that is periodically varied with a period matched with an integer multiple of half an emission wavelength at the light emitting section.

DETAILED DESCRIPTION OF THE INVENTION

One of the applications of the semiconductor light emitting device according to the embodiments of the invention is a light source for optical interconnects. In this case, to enhance adaptability to LSI processes based on silicon-based materials, the light emitting section of the semiconductor light emitting device according to the present embodiments is formed from a silicon-based semiconductor material, and further has a structure adapted to stimulated emission for the purpose of fast operation.

An optical resonator structure for facilitating stimulated emission can be realized by facet mirrors (Fabry-Perot resonator). However, in the configuration where a light emitting device is integrated in the same chip as optical interconnects and a light receiving device, the facet of the light emitting device is integrally coupled to a light waveguide, which is also silicon-based. In this structure, it is difficult to use reflection caused by refractive index difference at the facet. Hence, in the structure of the present embodiments, a periodic structure provided in the light emitting section of the semiconductor light emitting device is used as an optical resonator.

The embodiments of the invention will now be described with reference to the drawings. Some specific materials will be referred to in the following description. However, the embodiments of the invention can also be practiced using any other materials adapted to LSI processes, and the invention is not limited to the following embodiments.

First Embodiment

Figure 1:
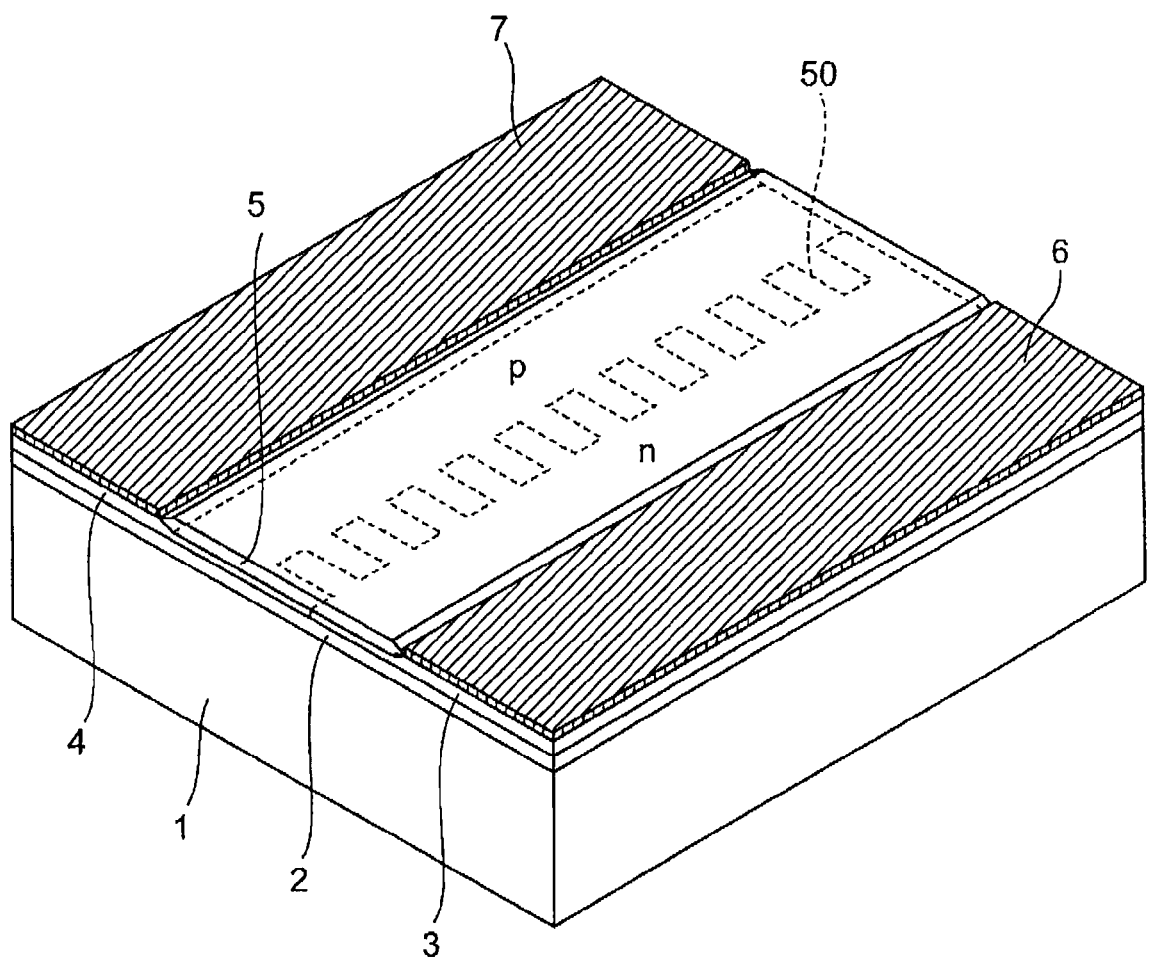
FIG. 1 is a perspective view showing a schematic configuration of a semiconductor light emitting device according to a first embodiment of the invention.
Figure 2:
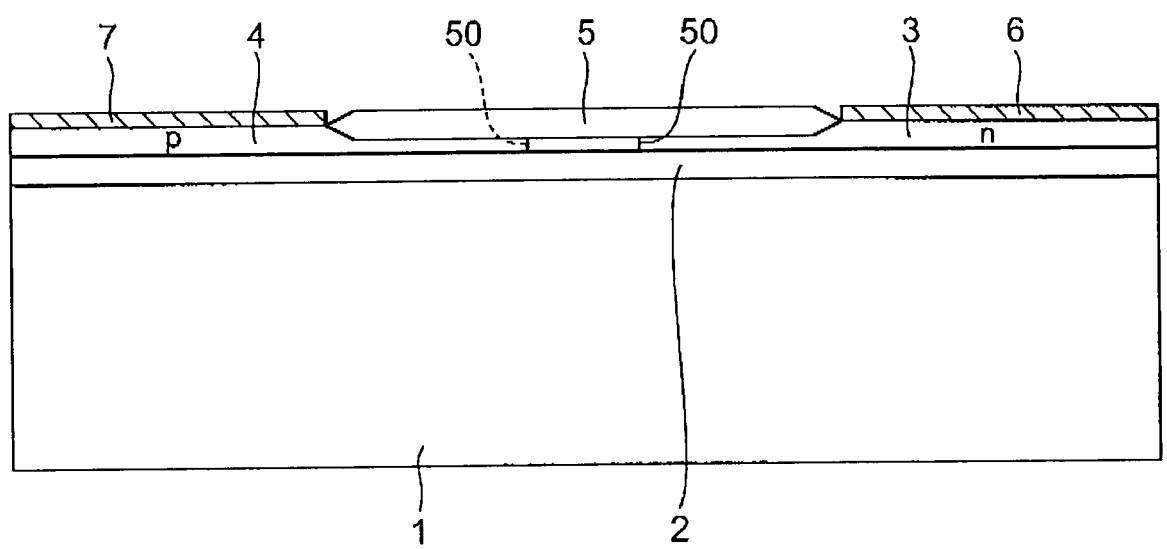
FIG. 2 is a cross-sectional view of the semiconductor light emitting device according to the first embodiment of the invention.
Figure 3:
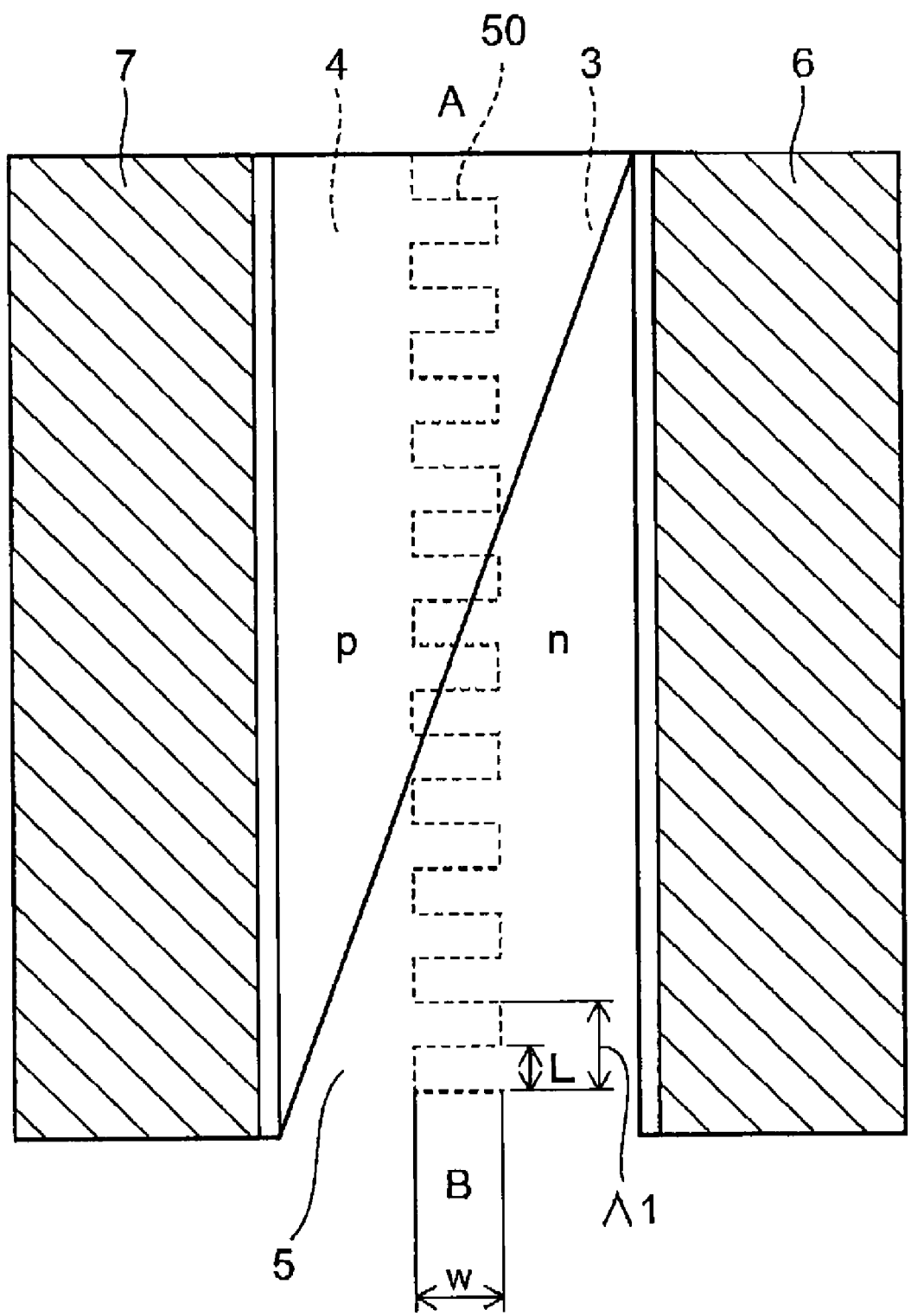
FIG. 3 is a top view of the semiconductor light emitting device according to the first embodiment of the invention.

FIG. 1 is a perspective view showing a schematic configuration of a semiconductor light emitting device according to a first embodiment. FIG. 2 is a cross-sectional view of the semiconductor light emitting device. FIG. 3 is a top view of the semiconductor light emitting device.

A silicon oxide film 2 is provided on a silicon substrate 1. A p-type semiconductor layer 4 and an n-type semiconductor layer 3 are provided on the silicon oxide film 2. The p-type semiconductor layer 4 and the n-type semiconductor layer 3 are illustratively made of silicon (Si). However, besides silicon, it is also possible to use silicon germanium (SiGe), gallium nitride (GaN), or silicon carbide (SiC). The p-type semiconductor layer 4 and the n-type semiconductor layer 3 are adjacent to each other in a direction generally parallel to the surface of the silicon substrate 1 to form a p-n homojunction 50, which serves as a light emitting section.

The p-type semiconductor layer 4 and the n-type semiconductor layer 3 are formed from a silicon layer in an SOI (silicon on insulator) structure by a process in which a p-type impurity (e.g., boron) and an n-type impurity (e.g., phosphorus) are ion-implanted into the silicon layer and activated by heat treatment. In this process, the ion implantation is performed using a mask that is patterned like a comb with a period corresponding to the emission wavelength at the light emitting section to form a periodic corrugated structure in the p-n homojunction 50. The periodic corrugated structure will be described later in detail.

After the p-n homojunction 50 is formed, the thickness of the p-n homojunction 50 and its neighborhood is decreased by the so-called LOCOS (local oxidation of silicon) process, in which the oxidation is performed by masking the electrode formation sections of the p-type semiconductor layer 4 and the n-type semiconductor layer 3. The silicon oxide film 5, which is formed simultaneously in this LOCOS process, provides passivation to the p-n homojunction 50, preventing interfacial leakage at the side surface of the p-n homojunction 50.

The p-n homojunction 50 in the silicon layer (the p-type semiconductor layer 4 and the n-type semiconductor layer 3), which is thinned by this LOCOS process, acquires light emitting capability. This is the effect of the quantum confinement of carriers in the extremely thin silicon layer sandwiched between the silicon oxide films 2 and 5.

A p-side electrode 7 is provided on the surface of the p-type semiconductor layer 4 beside the silicon oxide film 5, and an n-side electrode 6 is provided on the surface of the n-type semiconductor layer 3 beside the silicon oxide film 5. The p-side electrode 7 and the n-side electrode 6 are illustratively made of aluminum or silicide.

Next, the periodic corrugated structure of the p-n homojunction 50 is described in detail.

The p-n homojunction 50 in the thin silicon layer acquires light emitting capability, or optical gain. Hence, as shown in FIGS. 1 and 3, if the p-n homojunction 50 is corrugated with a period corresponding to the emission wavelength at the light emitting section, a structure of periodic modulation (increase and decrease) in optical gain is formed in the corrugating direction (the direction connecting between A and B in FIG. 3). That is, as viewed along a line connecting between A and B in FIG. 3, the optical gain increases at the portion where the p-n homojunction 50 exists, and decreases between the portions of the p-n homojunction 50 by the amount of decrease of minority carriers.

The length L of the p-type semiconductor layer 4 and the length L of the n-type semiconductor layer 3 along the corrugating direction are the same. By matching the corrugation period $\Lambda 1$ of the p-n homojunction 50 with an integer multiple of the emission wavelength (the wavelength of light propagating in the corrugating direction) $\lambda_{eff}$ at the light emitting section, that is, by matching the modulation frequency L of the optical gain with an integer multiple of $\lambda_{eff}/2$, the light propagating in the corrugating direction can be subjected to a periodic gain modulation and the optical reflection associated therewith.

This allows optical feedback or confinement, enabling optical amplification inside the periodic structure. That is, SLD operation can be achieved, and under some conditions, lasing (laser oscillation) can also be achieved. This results in forced emission from carriers by stimulated emission, reducing the effective lifetime of carriers and thereby increasing the response speed. Furthermore, the emission efficiency as a light emitting device is also increased.

For example, the thickness of the silicon layer where the p-n homojunction 50 is formed is 1.5 nm, the emission wavelength $\lambda_0$ in vacuum or in air is approximately 850 nm, and the silicon oxide films 2 and 5 vertically sandwiching the silicon layer is sufficiently thick (e.g., 2000 nm). Then the effective refractive index $n_{eff}$ experienced by light propagating in the corrugating direction of the p-n homojunction 50 is 1.455, which is comparable to the refractive index of the silicon oxide film ($SiO_2$), 1.450. In this case, if the corrugation period $\Lambda 1$ of the p-n homojunction 50 is equal to the emission wavelength at the light emitting section, $\lambda_{eff}=\lambda_0/n_{eff}=584$ nm, or an integer multiple thereof, then optical feedback or confinement can be achieved in the periodic corrugated structure of the p-n homojunction 50

In particular, if the corrugation period $\Lambda 1$ is equal to twice $\lambda_{eff}$, i.e. 1168 nm, then the second-order diffraction effect produces perpendicular emission components. The silicon oxide film 5 is transparent to the light of these components, and the light can be extracted also in a direction generally perpendicular to the device surface (the upward direction in FIG. 2). This enables optical waveguiding to the elements provided above the light emitting device in an LSI with a multilayer interconnection structure, for example.

In general, in the case of a DFB (distributed feedback) semiconductor laser (hereinafter referred to as DFB laser), in which lasing is caused by optical feedback using a grating, the grating is formed at the heterointerface, or formed by periodic segmentation of the active layer per se. Hence the periodic optical reflection mechanism is based on the spatial modulation of the refractive index (refractive index modulation). In this case, the fundamental lasing mode is not at the Bragg reflection wavelength of the grating, but is composed of two wavelengths outside the stop band (forbidden band for lasing) centered on the Bragg wavelength. Furthermore, in practice, depending on the terminating phase of the grating and other factors, lasing occurs in either or both of the two fundamental lasing modes, and under some conditions, unfortunately, mode jumps occur between the two fundamental modes and produce large noise. To solve these problems, a grating based on optical gain modulation rather than refractive index modulation is effective. In the case of optical gain modulation, the lasing wavelength is just at the Bragg reflection wavelength, allowing lasing at a single wavelength in principle. However, because typical DFB lasers are based on the semiconductor heterojunction structure, an attempt to modulate only the optical gain of the active layer entails some refractive index modulation. Thus it has been difficult to realize a pure optical gain modulation structure.

In contrast, in this embodiment, where the p-n homojunction 50 is corrugated to provide periodic modulation of optical gain, it is feasible to realize a pure optical gain modulation structure with little variation in refractive index. A slight difference in refractive index may occur between the p-type semiconductor layer 4 and the n-type semiconductor layer 3 depending on the levels of impurity concentration, but the difference is negligible. Furthermore, the difference in refractive index can be substantially eliminated by adjusting the impurity concentrations thereof.

The feasibility of a pure optical gain modulation structure with little variation in refractive index leads to the feasibility of a DFB laser based on optical gain modulation where the fundamental lasing mode is established as a single mode in principle. Hence this embodiment can provide a semiconductor light emitting device being free from variation in the lasing wavelength due to the terminating phase of the grating and being capable of stable lasing at a single wavelength in principle. Furthermore, SLD operation, which involves optical amplification by stimulated emission insufficient for lasing, can also be made efficient because stimulated emission is centered on a single wavelength.

As described above, according to this embodiment, a silicon-based stimulated emission semiconductor light emitting device can be fabricated by a simple process being highly adaptable to the conventional LSI processes and having very high reproducibility and reliability, and can be easily applied to a high-speed light source for optical interconnects on an LSI chip. Thus the practicality of LSI on-chip optical interconnects can be significantly increased, making a great contribution to the sophistication of information and communication equipment.

It is noted that the fundamental transverse mode of light propagating in the corrugating direction (the direction connecting between A and B in FIG. 3) has a spread of approximately a half wavelength. The corrugation width w of the p-n homojunction (the width of undulation perpendicular to the direction connecting between A and B in FIG. 3) is preferably ½ or more of the emission wavelength at the light emitting section so that the guided light is efficiently subjected to the periodic modulation of optical gain.

Furthermore, the thin-film silicon layer has a high resistance. Hence, except for the width required for light emission, the silicon layer (the p-type semiconductor layer 4 and the n-type semiconductor layer 3) can be gradually thickened toward the outside (toward the electrodes 6 and 7). This configuration can be realized by repeating the above-described LOCOS process or the STI (shallow trench isolation) process to vary the thickness of the silicon layer along the horizontal direction in FIG. 2 in thinning the silicon layer by oxidation. Alternatively, the region selectively oxidized by the LOCOS process can be configured to have a narrower initial width, and the bird's beak due to the spread of oxidation to below the mask can be used to form a structure in which the silicon layer is gradually thickened toward the outside.

Second Embodiment

Figure 4:
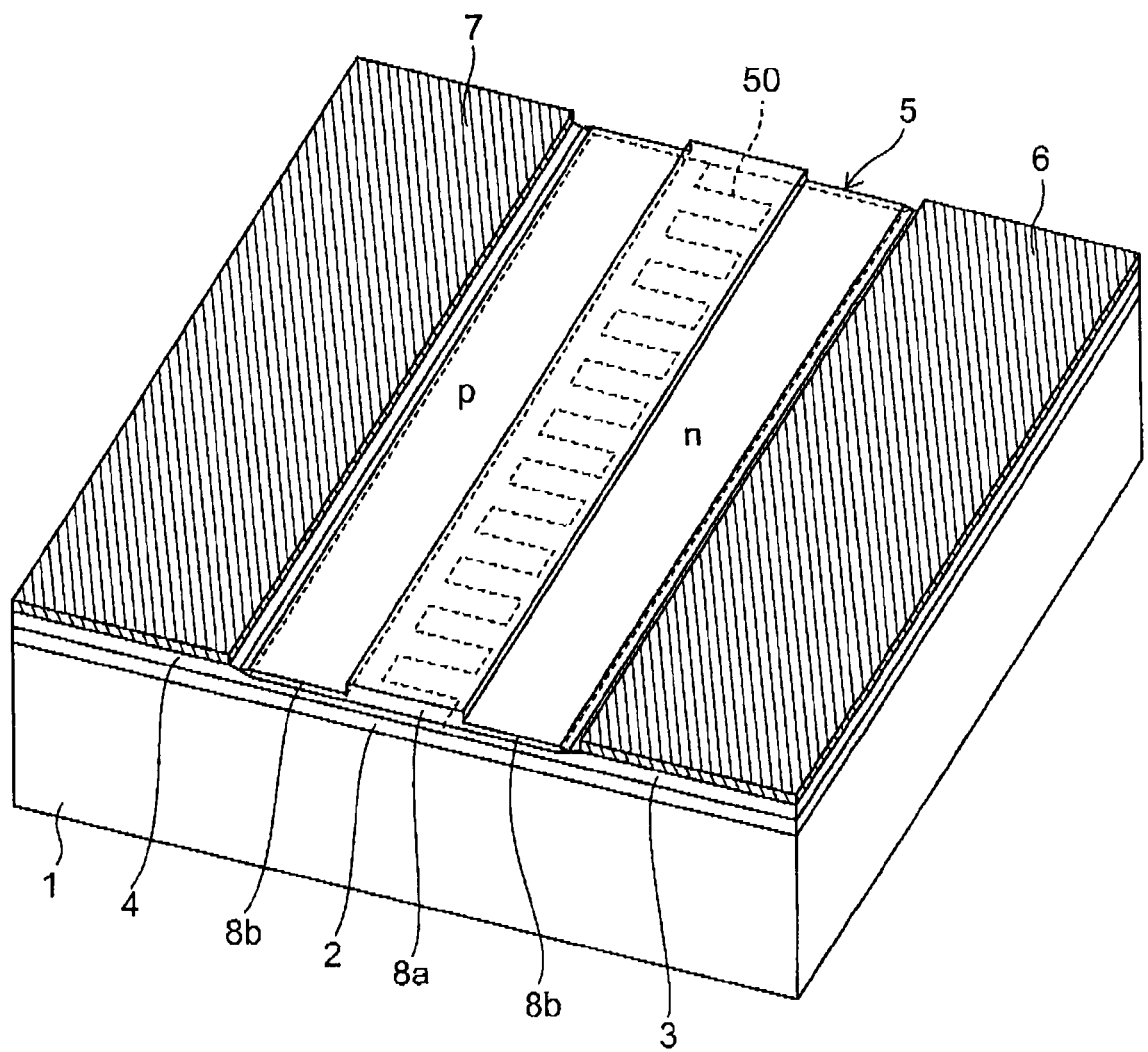
FIG. 4 is a perspective view showing a schematic configuration of a semiconductor light emitting device according to a second embodiment of the invention.
Figure 5:
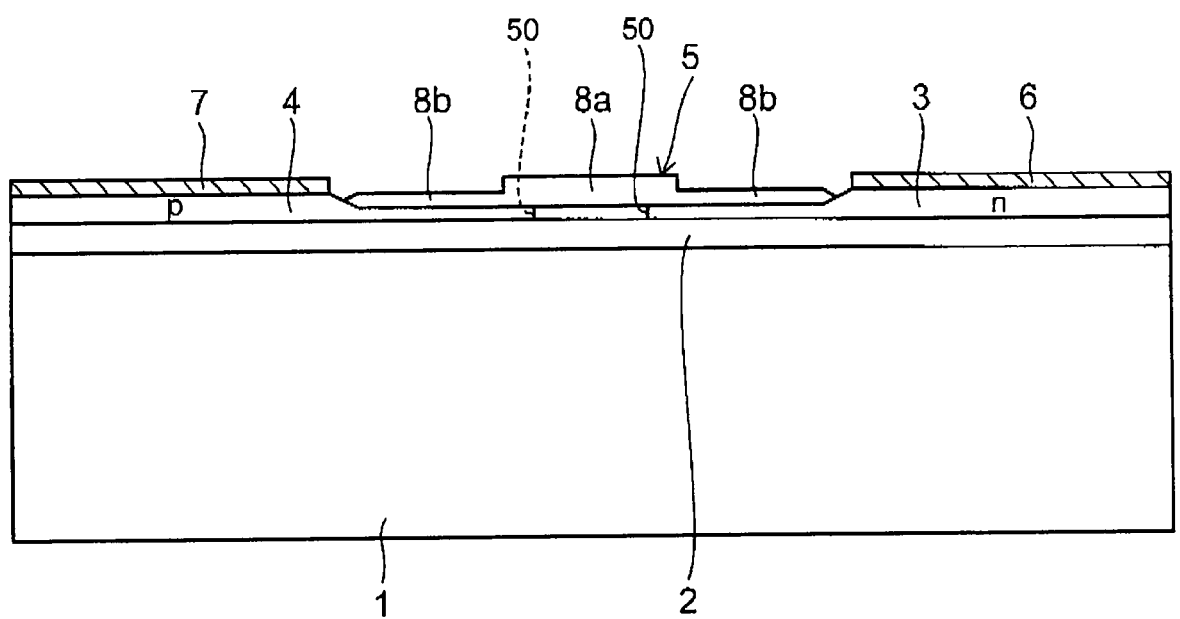
FIG. 5 is a cross-sectional view of the semiconductor light emitting device according to the second embodiment of the invention.

FIG. 4 is a perspective view showing a schematic configuration of a semiconductor light emitting device according to a second embodiment. FIG. 5 is a cross-sectional view of the semiconductor light emitting device. In FIGS. 4 and 5, the same elements as those in the above first embodiment are labeled with like reference numerals, and the detailed description thereof is omitted.

In this embodiment, a light waveguide structure for guiding light in the corrugating direction of the p-n homojunction 50 is provided near the light emitting section. More specifically, the silicon oxide film 5 is provided with a thickness difference between the portion (ridge) 8a above the light emitting section (the corrugating portion of the p-n homojunction 50) and the side portion 8b outside the ridge 8a.

In the silicon oxide film 5, the ridge 8a above the light emitting section (the corrugating portion of the p-n homojunction 50) is thicker than the side portion 8b. That is, the portion 8b beside the light emitting section is thinner than the ridge 8a above the light emitting section. Hence the refractive index experienced by light traveling in the corrugating direction of the p-n homojunction 50 is higher in the ridge 8a and lower in the side portion 8b, allowing the light to propagate in the corrugating direction while being confined in the ridge 8a.

This prevents lateral dissipation of light, enabling efficient optical feedback in the periodic corrugated structure of the p-n homojunction 50. Furthermore, advantageously, the transverse mode of the guided light is stabilized, operation instability due to mode variation is suppressed, and the efficiency of optical coupling to the light waveguide is also increased.

The ridge structure as described above can be formed by selectively trimming (etching) the portion outside the light emitting section in the silicon oxide film 5, where the etching amount and thickness can be suitably configured by optical mode design. Alternatively, instead of trimming the silicon oxide film 5, a silicon nitride film, for example, having a higher refractive index than the silicon oxide film 5 can be selectively provided above the light emitting section in the silicon oxide film 5 to form the above ridge structure.

Third Embodiment

Figure 6:
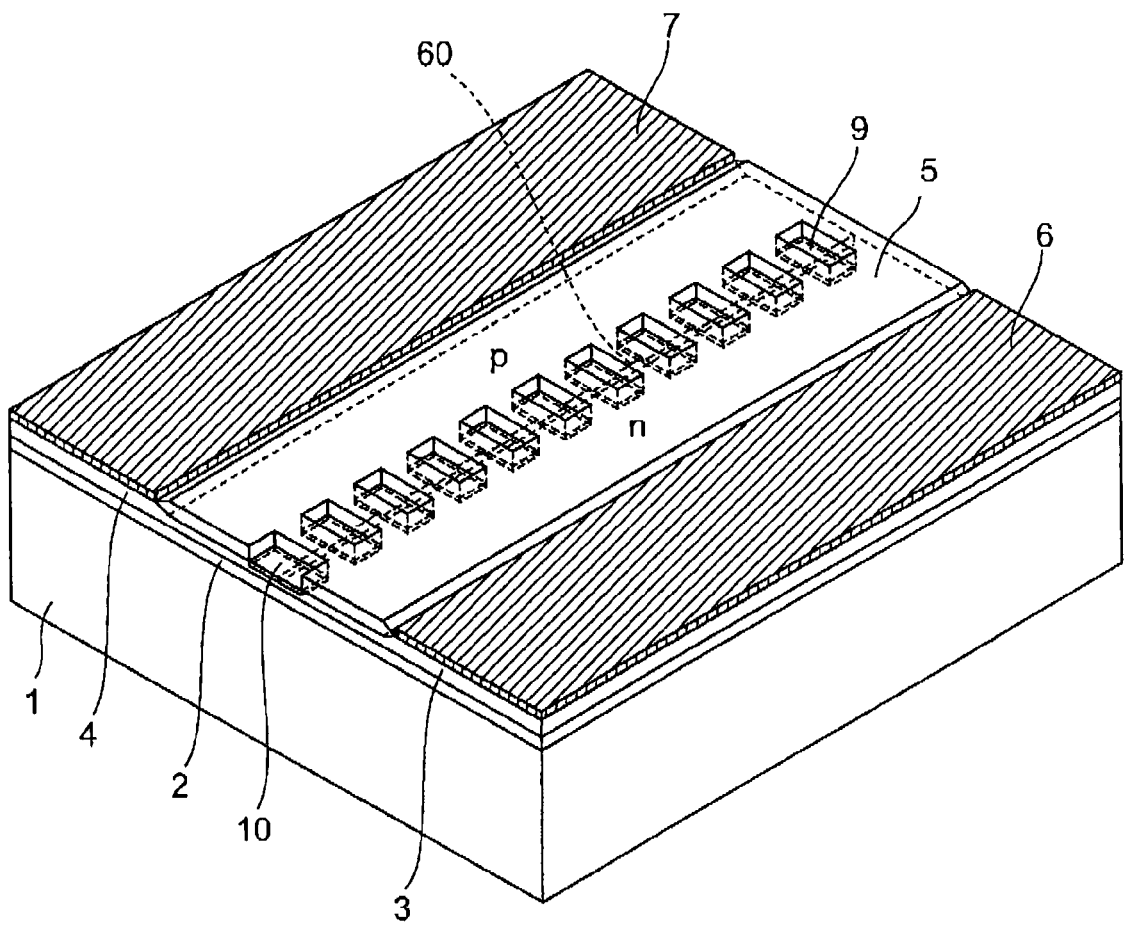
FIG. 6 is a perspective view showing a schematic configuration of a semiconductor light emitting device according to a third embodiment of the invention.
Figure 7:
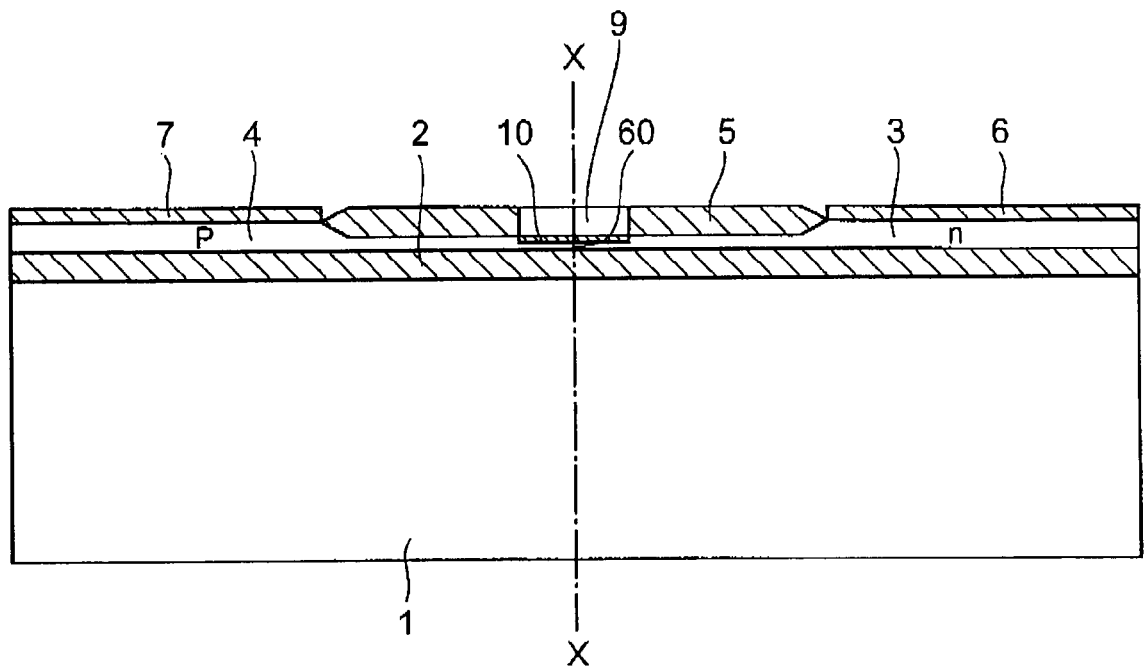
FIG. 7 is a cross-sectional view of the semiconductor light emitting device according to the third embodiment of the invention.
Figure 8:
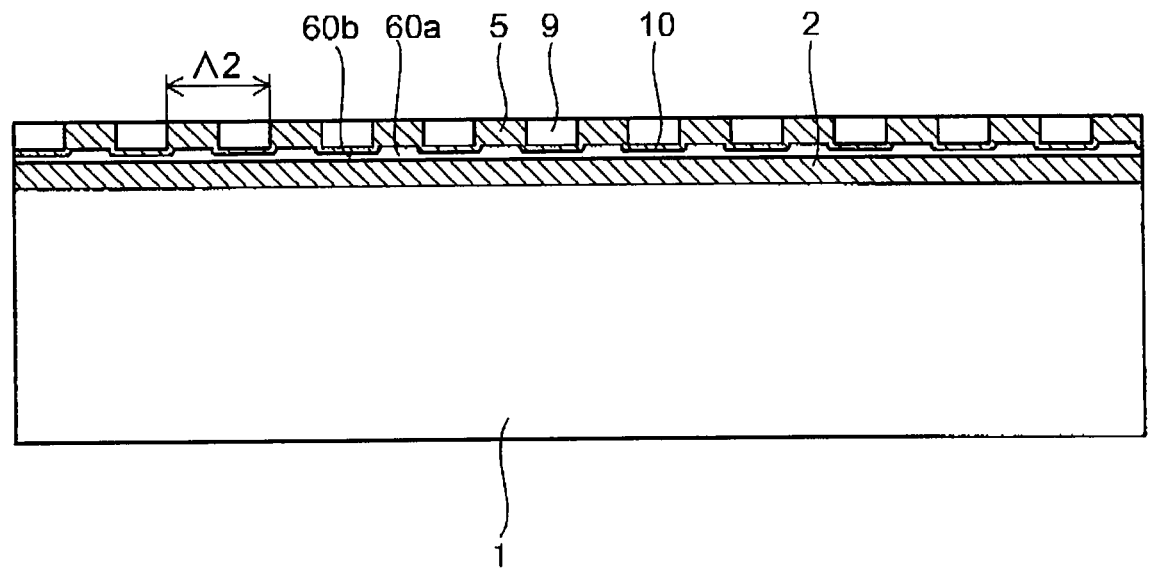
FIG. 8 is the X-X cross-sectional view in FIG. 7.

FIG. 6 is a perspective view showing a schematic configuration of a semiconductor light emitting device according to a third embodiment. FIG. 7 is a cross-sectional view of the semiconductor light emitting device. FIG. 8 is the X-X cross-sectional view in FIG. 7. The same elements as those in the above embodiments are labeled with like reference numerals, and the detailed description thereof is omitted.

Also in this embodiment, a silicon oxide film 2 is provided on a silicon substrate 1. A p-type semiconductor layer 4 and an n-type semiconductor layer 3, being adjacent to each other in a direction generally parallel to the surface of the silicon substrate 1 to form a p-n homojunction, are provided on the silicon oxide film 2. The p-n homojunction 60 serves as a light emitting section. However, in this embodiment, the p-n homojunction 60 is not corrugated, but is formed linearly.

In the silicon oxide film 5, windows 9 are formed by selective etching-away above the p-n homojunction 60 and its neighborhood sandwiching the p-n homojunction 60. The windows 9 are equally spaced (periodically formed) in the linearly extending direction of the p-n homojunction 60.

The selective removal of the silicon oxide film 5 for forming the windows 9 exposes the underlying silicon layer (including the p-n homojunction 60). By additionally oxidizing the exposed surface, a silicon oxide film 10 thinner than the silicon oxide film 5 is formed at the surface of the silicon layer (including the p-n homojunction 60) below the windows 9. The thickness of the silicon layer below this silicon oxide film 10 is thinner than the silicon layer below the portion outside the windows 9 and the silicon oxide film 10 by the amount of the additionally formed silicon oxide film 10.

More specifically, the surface of the p-n homojunction 60 is selectively exposed by forming the windows 9, and then additionally oxidized. As shown in FIG. 8, this results in a structure in which the width (thickness) of the p-n homojunction 60 is periodically varied in the linearly extending direction (horizontal direction in FIG. 8) of the p-n homojunction 60. The width (thickness) of the p-n homojunction 60 is periodically varied at a period matched with an integer multiple of half the emission wavelength at the light emitting section (the wavelength of light propagating horizontally in FIG. 8).

In the light propagation direction, a periodic variation occurs in the thickness of the silicon layer (the p-type semiconductor layer 4 and the n-type semiconductor layer 3) in which the p-n homojunction 60 is formed. This results in a periodic variation in the equivalent refractive index and realizes a light emitting device including a grating based on refractive index modulation. Here, because the light emitting section is based on quantum confinement by silicon thin films, the thick portion 60a and the thin portion 60b of the silicon layer (p-n homojunction 60) are different in emission wavelength (effective bandgap), and further different in emission efficiency due to the difference in the strength of the quantum confinement effect. Consequently, a spatial modulation of optical gain is superposed on the structure.

For example, in FIG. 8, the thick portion 60a of the p-n homojunction 60 (or the silicon layer) has a thickness of 1.5 nm, the silicon oxide film 10 formed by additional oxidation has a thickness of 1 nm, and the thin portion 60b of the p-n homojunction 60 (or the silicon layer) below the silicon oxide film 10 has a thickness of 0.5 nm. Then the thick portion 60a exhibits a bandgap of 850 nm at the emission wavelength, whereas the thin portion 60b exhibits a bandgap of approximately 600 nm at the emission wavelength depending on the interface roughness. The difference between these bandgaps produces a difference in carrier injection, substantially causing the thick portion 60a to emit light. Here, the thin portion 60b serves as a barrier for carrier confinement, and acts as a semiconductor transparent to the propagation light (with a wavelength of 850 nm). Hence the light with a wavelength of 850 nm emitted from the thick portion 60a is guided with a substantial gain.

Also in this embodiment, a silicon-based stimulated emission semiconductor light emitting device can be fabricated by a simple process being highly adaptable to the conventional LSI processes and having very high reproducibility and reliability, and can be easily applied to a high-speed light source for optical interconnects on an LSI chip. Thus the practicality of LSI on-chip optical interconnects can be significantly increased, making a great contribution to the sophistication of information and communication equipment.

As described above, this embodiment can provide both the effects of refractive index modulation and optical gain modulation. In effect, the refractive index modulation is dominant, causing doubling of the fundamental mode (occurrence of a stop band), which is specific to a grating device based on refractive index modulation. However, a quasi-single mode lasing, or lasing of only one of the fundamental modes, can be realized by appropriately selecting the terminating facet phase of the grating (the periodic structure of width variation in the p-n homojunction 60).

In the additional oxidation for forming a silicon oxide film 10 at the surface of the silicon layer exposed from the windows 9, the oxidation is allowed to proceed until the silicon layer is completely oxidized and the remaining thickness vanishes. As described above, the light emitted from the thick portion 60a is subjected to lasing with a substantial gain. Thus, light emission in the thin silicon layer 60b is wasted, and carriers supplied to the thin silicon layer 60b are also wasted. Hence, without the silicon layer below the additionally oxidized portion (the thin silicon oxide film 10), the leak current through the thin silicon layer is eliminated, and the ineffective current is decreased by that amount.

Furthermore, in this embodiment, the p-n homojunction is formed linearly. Hence, advantageously, the masks used in the step of p-type impurity ion implantation and the step of n-type impurity ion implantation are less susceptible to pattern misalignment, and the etching of the windows 9 has high reproducibility because it is selective etching. Thus this embodiment has the advantage of small process variation.

Fourth Embodiment

Figure 9:
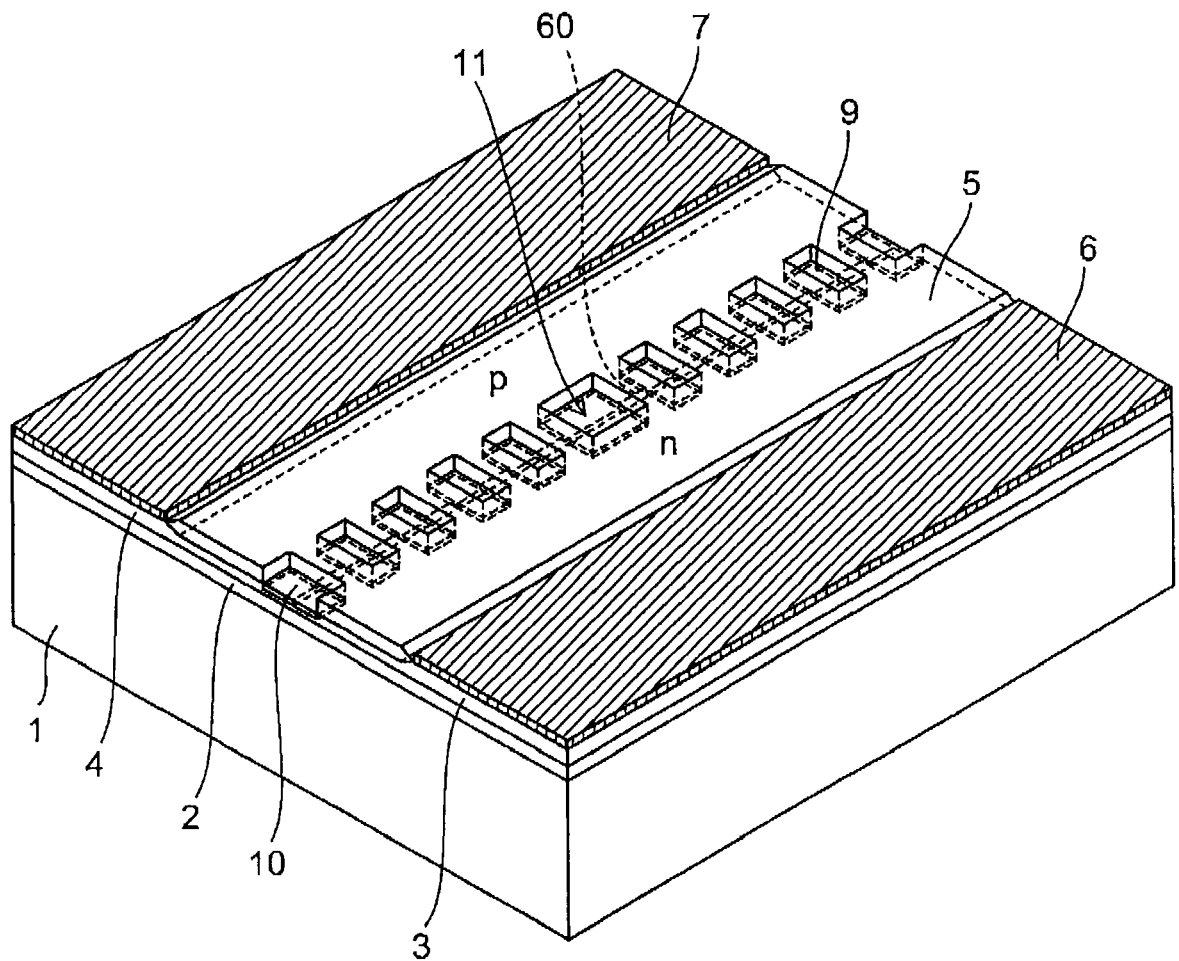
FIG. 9 is a perspective view showing a schematic configuration of a semiconductor light emitting device according to a fourth embodiment of the invention.
Figure 10:
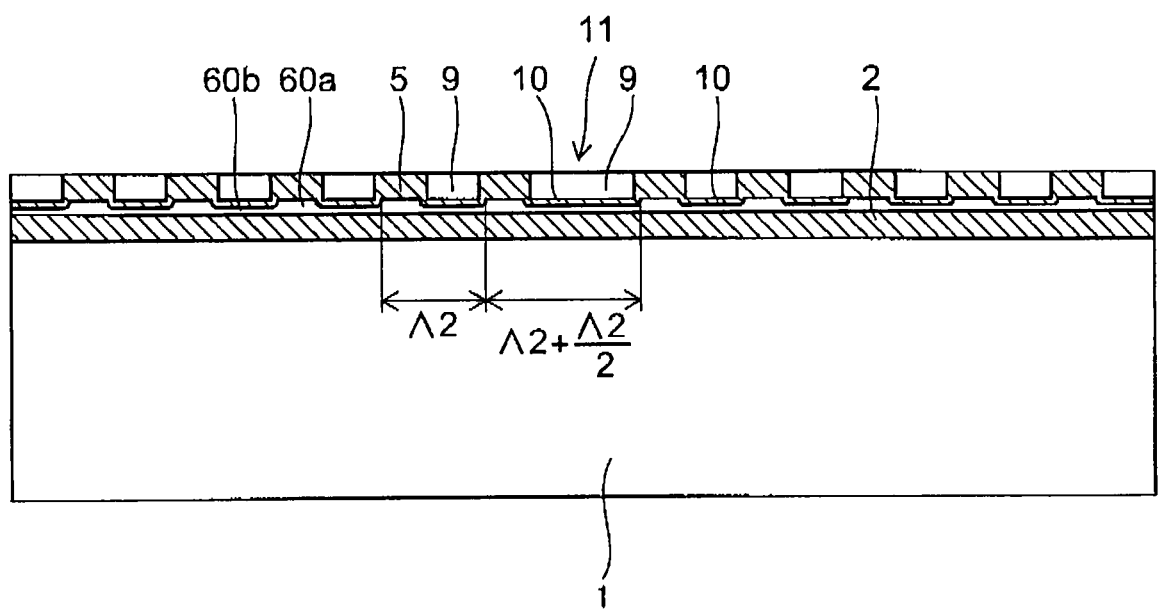
FIG. 10 is a cross-sectional view of the semiconductor light emitting device according to the fourth embodiment of the invention, showing a cross section in a direction generally parallel to the extending direction (light propagation direction) of the p-n homojunction.

FIG. 9 is a perspective view showing a schematic configuration of a semiconductor light emitting device according to a fourth embodiment. FIG. 10 is a cross-sectional view of the semiconductor light emitting device, showing a cross section in a direction generally parallel to the extending direction (light propagation direction) of the p-n homojunction.

The main structure of the semiconductor light emitting device according to this embodiment is the same as that of the semiconductor light emitting device according to the third embodiment, and the detailed description thereof is omitted.

This embodiment includes a portion for shifting the phase of the periodic structure of width (thickness) variation in the p-n homojunction 60 with a period of Λ2. More specifically, a phase shifter 11 is provided to shift the periodic structure of the windows 9 midway by half a period (pitch). With the phase shift of the periodic structure of the windows 9, the phase of the periodic structure of the underlying thin silicon oxide film (additional oxide film) 10 and the thin silicon layer therebelow is also shifted by a half period. Consequently, the phase of the periodic width (thickness) variation in the p-n homojunction 60 is shifted by a half period.

In a light emitting device based on refractive index modulation, single mode lasing can be achieved by adjusting the terminating phase of the grating. However, in the case where the portion for outputting light from the light emitting device is connected to a light waveguide with low reflection, the terminating phase of the grating cannot be experienced as a refractive index difference, but the condition is similar to reflection-free termination, often causing two-mode lasing. Even in such cases, lasing at the Bragg wavelength can be achieved by shifting the phase of the grating midway by a half period. In this embodiment, stable single mode lasing can be achieved by the phase shifter 11 described above.

In the example shown in FIGS. 9 and 10, a phase shifter 11 for shifting the phase by a half period is provided at one position. However, features for shifting the phase by a quarter period can be separately placed at two positions to collectively constitute a phase shifter for shifting the phase by a half period. This configuration advantageously alleviates spatial hole burning of carriers due to the concentration of internal optical density on the phase shifter.

Fifth Embodiment

In this embodiment, the wavelength of light reflected by the corrugated periodic structure or the periodic structure of width (thickness) variation in the p-n homojunction described above is set to be longer than the peak wavelength of the spontaneous emission spectrum of the light emitting section at an ambient temperature of room temperature or the operating reference temperature. This embodiment is applicable to any of the above embodiments.

In the semiconductor light emitting device according to the above embodiments, the optical feedback wavelength (lasing wavelength) determined by the period of the periodic structure can be set to an arbitrary wavelength relative to the emission spectrum distribution of the light emitting section. In general, spontaneous emission without optical feedback has a relatively broad emission spectrum. For example, light emission at 850 nm has a spectral width of 100 to 150 nm in terms of half width. Furthermore, a DFB laser for single longitudinal mode lasing has a spectral width of approximately 0.1 to 1 nm, allowing for considerable width in setting the wavelength.

At an ambient temperature of room temperature or the operating reference temperature, the optical feedback wavelength is set to the long-wavelength side of the spontaneous emission spectral peak so that lasing occurs at a higher threshold than lasing at the spontaneous emission spectral peak. Then, when the device temperature increases, the difference in rate of change between the variation of the optical feedback wavelength determined by the temperature variation of refractive index and the variation of the spontaneous emission spectral peak due to the temperature variation of the bandgap (variation to the long-wavelength side associated with the temperature increase is smaller for the optical feedback wavelength than for the spontaneous emission spectral peak) results in decreasing the gap between the spontaneous emission (optical gain) spectral peak and the optical feedback wavelength. Thus the optical feedback wavelength moves from the periphery to the center of the optical gain profile to relatively increase the optical gain. This effect cancels out the decrease in the absolute amount of optical gain due to the temperature increase so that the lasing threshold can be kept nearly constant.

The embodiments of the invention have been described with reference to the examples. However, the invention is not limited thereto, but can be variously modified within the spirit of the invention. For example, the specific numerical values of the period, wavelength, and other parameters as well as the materials described above are illustratively only, and can be suitably configured or selected within the spirit of the invention.

The optical waveguiding structure provided with a ridge as in the second embodiment can also be applied to and combined with the other embodiments.

In the above each embodiment, including the accompanying drawings, the semiconductor light emitting device is extracted for description. In the case where the semiconductor light emitting device in the each embodiment described above is used as a light source for optical interconnects on an LSI chip of a semiconductor module, the semiconductor light emitting device 110 is integrated on the same silicon substrate 100 as a light waveguide 120 coupled to its facet, a light receiving device 130, and other LSI circuits 140. It is noted that the invention is also applicable to the stand-alone configuration of the semiconductor light emitting device.

The invention claimed is:

1. A semiconductor light emitting device comprising:
   a silicon substrate;
   a p-type semiconductor layer provided on the silicon substrate;
   an n-type semiconductor layer provided on the silicon substrate, the n-type semiconductor layer adjoining the p-type semiconductor layer; and
   a light emitting section formed at a p-n homojunction between the p-type semiconductor layer and the n-type semiconductor layer, the p-n homojunction being substantially perpendicular to a surface of the silicon substrate, and the p-n homojunction having a width that is periodically varied with a period matched with an integer multiple of half an emission wavelength at the light emitting section.

2. The semiconductor light emitting device of claim 1, wherein the p-type semiconductor layer and the n-type semiconductor layer are made of material including silicon.

3. The semiconductor light emitting device of claim 1, wherein the p-n homojunction is formed linearly.

4. The semiconductor light emitting device of claim 1, further comprising a portion configured to shift the phase of the periodic structure of the width variation in the p-n homojunction by half the period, the portion being provided at least one position in the periodic structure.

5. The semiconductor light emitting device of claim 4, wherein a phase shifter configured to shift the phase by half the period is provided at one position.

6. The semiconductor light emitting device of claim 4, wherein phase shifters configured to shift the phase by quarter the period are separately provided at two positions.

7. The semiconductor light emitting device of claim 1, wherein the light emitting section is sandwiched between insulating films.

8. The semiconductor light emitting device of claim 7, wherein windows are selectively provided in an insulating film provided on the light emitting section out of the insulating films sandwiching the light emitting section.

9. The semiconductor light emitting device of claim 8, wherein a portion below the windows in the p-n homojunction is thinner than an outside portion below the windows.

10. The semiconductor light emitting device of claim 1, wherein in a structure in which the width of the p-n homojunction is periodically varied, a portion with the large width has a wider bandgap than a portion with the small width.

11. The semiconductor light emitting device of claim 1, wherein the wavelength of light reflected by the periodic structure of the p-n homojunction is set to be longer than peak wavelength of the spontaneous emission spectrum of the light emitting section at an ambient temperature of room temperature or an operating reference temperature.

* * * * *